(12) United States Patent
Jaiswal et al.

(10) Patent No.: US 10,825,510 B2
(45) Date of Patent: Nov. 3, 2020

(54) MULTI-BIT DOT PRODUCT ENGINE

(71) Applicant: Purdue Research Foundation, West Lafayette, IN (US)

(72) Inventors: Akhilesh Ramlaut Jaiswal, West Lafayette, IN (US); Amogh Agrawal, West Lafayette, IN (US); Kaushik Roy, West Lafayette, IN (US); Indranil Chakraborty, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 112 days.

(21) Appl. No.: 16/271,811

(22) Filed: Feb. 9, 2019

(65) Prior Publication Data

US 2020/0258569 A1 Aug. 13, 2020

(51) Int. Cl.
*G11C 11/419* (2006.01)
*G06F 17/16* (2006.01)
(Continued)

(52) U.S. Cl.
CPC ............ *G11C 11/419* (2013.01); *G06F 17/16* (2013.01); *G11C 7/18* (2013.01); *G11C 11/412* (2013.01); *G11C 7/06* (2013.01)

(58) Field of Classification Search
CPC ................ G11C 11/40; G11C 11/4063; G11C 11/4085–4091; G11C 11/4094–4097;
(Continued)

(56) References Cited

U.S. PATENT DOCUMENTS

| 2019/0043560 A1* | 2/2019 | Sumbul | G06N 3/0635 |
| 2019/0065151 A1* | 2/2019 | Chen | G06F 7/5016 |
| 2019/0102359 A1* | 4/2019 | Knag | G06N 3/063 |

OTHER PUBLICATIONS

A. Jaiswal, I. Chakraborty, A. Agrawal and K. Roy, "8T SRAM Cell as a Multibit Dot-Product Engine for Beyond Von Neumann Computing," in IEEE Transactions on Very Large Scale Integration (VLSI) Systems, vol. 27, No. 11, pp. 2556-2567, Nov. 2019 ( Year: 2019).*

(Continued)

*Primary Examiner* — Matthew D Sandifer
(74) *Attorney, Agent, or Firm* — Piroozi-IP, LLC

(57) ABSTRACT

A method of obtaining an in-memory vector-based dot product is disclosed, which includes providing a matrix of memory cells having M rows, each memory cell in each row holding a value and having dedicated read transistors T1 and T2, where T1 is controlled by the value held in the associated memory cell and T2 is controlled by a row-dedicated source ($v_{in}$) for each row, the combination of the T1 and T2 transistors for each cell selectively (i) couple a reference voltage with a column-dedicated read bit line (RBL) for each column for an in-memory vector-based dot product operation or (ii) couple ground with the column-dedicated read bit line (RBL) for each column for a memory read operation, where total resistance of the read transistors (R) for each cell in each row is based on $Rmax/2^{(M-1)}, \ldots Rmax$, where Rmax is the resistance of the least significant cell in each row.

20 Claims, 15 Drawing Sheets

(51) Int. Cl.
*G11C 11/412* (2006.01)
*G11C 7/18* (2006.01)
*G11C 7/06* (2006.01)

(58) Field of Classification Search
CPC ... G11C 11/412–419; G11C 7/12; G11C 7/18; G11C 7/06; G11C 7/08; G11C 7/1006; G11C 7/1045; G11C 7/1051; G11C 7/1069; G06F 17/16
See application file for complete search history.

(56) References Cited

OTHER PUBLICATIONS

Lee et al., A 17.5 fJ/bit Energy-efficient Analog SRAM for Mixed-signal Processing, 2016, 1010-1013.
Takeda et al., A Read-Static-Noise-Margin-Free SRAM Cell for Low-VDD and High-Speed Applications, IEEE Journal of Solid-State Circuits, 2006, 113-121, vol. 41, No. 1.
Chakraborty et al., Technology Aware Training in Memristive Neuromorphic Systems based on non-ideal Synaptic Crossbars, 2017.
Chang et al., A 5.3GHz 8T-SRAM with Operation Down to 0.41V in 65nm CMOS, Symposium on VLSI Circuits Digest of Technical Papers, 2007, 252-253.
Posser et al., Analyzing the Electromigration Effects on Different Metal Layers and Different Wire Lengths, 21st IEEE International Conference on Electronics, Circuits and Systems (ICECS), 2014, 682-685.
Changpinyo et al., The Power of Sparsity in Convolutional Neural Networks, 2017.
Han et al., Learning both Weights and Connections for Efficient Neural Networks, Advances in Neural Information Processing Systems, 2015.
Yang et al., Memristive devices for computing, Nature nanotechnology, 2012, 13-24, vol. 8, No. 1.
Zhang, Performance Comparison of SRAM Cells Implemented in 6, 7 and 8-Transistor Cell Topologies, Date Unknown.
Li et al., Analogue signal and image processing with large memristor crossbars, Nature Electronics, 2017, 52-59, vol. 1, No. 1.
Borghetti et al., 'Memristive' switches enable 'stateful' logic operations via material implication, Nature, 2010, 873-876, vol. 464.
Dong et al., A 0.3 v vddmin 4+ 2t sram for searching and in-memory computing using 55nm ddc technology, Symposium on VLSI Circuits Digest of Technical Papers, 2017, C160-C161.
Agrawal et al., X-sram: Enabling in-memory boolean computations in cmos static random access memories, IEEE Transactions on Circuits and Systems-I: Regular Papers, 2018, 4219-4232, vol. 65, No. 12.
Chang et al., Stable SRAM Cell Design for the 32 nm Node and Beyond, Symposium on VLSI Technology Digest of Technical Papers, 2005, 128-129.
Rumelhart et al., "Learning internal representations by error propagation," Tech. Rep., 1985.

\* cited by examiner

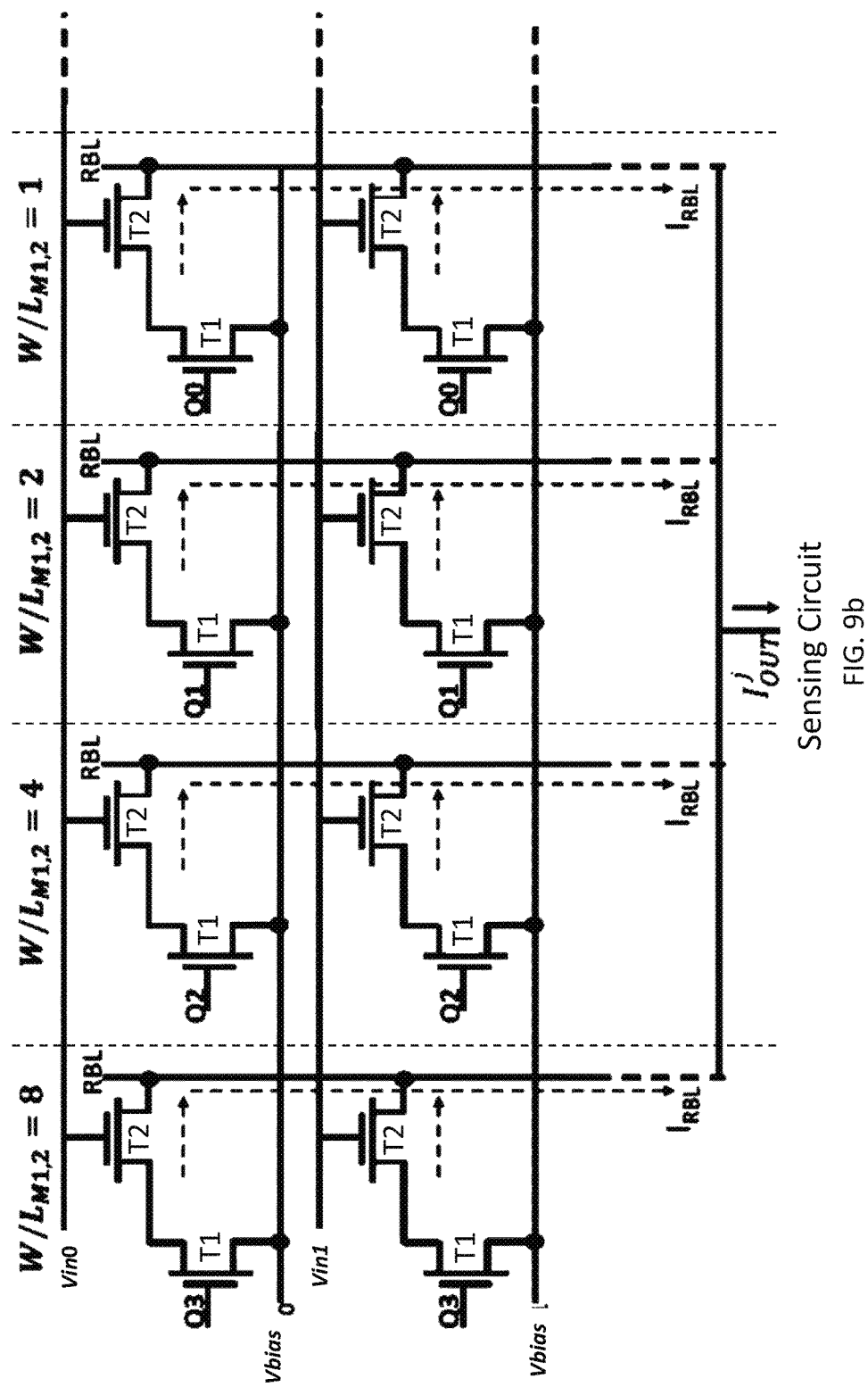

US 10,825,510 B2

MULTI-BIT DOT PRODUCT ENGINE

STATEMENT REGARDING GOVERNMENT FUNDING

This invention was not made with government support.

TECHNICAL FIELD

The present disclosure generally relates to electronic memory cells, and in particular, to electronic memory cells capable of providing in-memory arithmetic operation.

BACKGROUND

This section introduces aspects that may help facilitate a better understanding of the disclosure. Accordingly, these statements are to be read in this light and are not to be understood as admissions about what is or is not prior art.

Traditionally, a computer's architecture has included (i) a processor, (ii) memory, and (iii) other peripheral components. This architecture is often referred to as the von-Neumann architecture, after its inventor. This architecture is based on decoupling the memory from the processor, and is found in millions of computers worldwide. A schematic of this architecture 1 is shown in FIG. 1, where a memory 2 is decoupled from the processor 4, and where the memory 2 and the processor 4 communicate via data exchange bus 6. While there has been an explosion of computing powers using this architecture, it is now failing to answer the call of data exchange in such applications as big-data, artificial intelligence, Internet-of-things (IoT), and other data intensive operations. The shortcoming of this architecture is mainly due to a bottleneck 8 found between the memory 2 and the processor 4. This bottleneck 8 mainly arises from a limited data transfer rate between these two physically decoupled units. There are two major challenges with this bottleneck: (1) cycle time needed for data transfer (i.e., throughput), and (2) energy consumption associated with data transfer. To combat these two drawbacks associated with the bottleneck 8, one approach investigated in the prior art is to utilize in-memory vector computations. In such cases, not only does the decoupled memory maintain data it also provides rudimentary logic operations. These in-memory operations, thus, remove some of the issues associated with the bottleneck 8 as (1) data transfer between the memory 2 and the processor 4 is reduced, and (2) consequently energy consumption is also reduced.

With respect to the CMOS technology, Boolean in-memory operations have been in various architectures. For example, in one such architecture, a vector Boolean operations is realized using six transistor static random access memory (6T SRAM) cells. In another such architecture, 8T SRAM cells were used as vector compute primitives, specifically, owing to their decoupled read and write ports. While these architectures are based on vector Boolean operations, the most frequent and compute intensive function required for numerous applications such as machine learning is the dot product operation. Few works based on analog computations in SRAM cells can be found in the prior art. These works use 6T SRAM cells and rely on the resultant accumulated voltage on the bit-lines (BLs). Not only 6T SRAMs are prone to read-disturb failures, the failures are also a function of the voltage on the BLs. This leads to a tightly constrained design space for the proposed 6T SRAM based analog computing. Moreover, multi-bit, highly parallel dot products have yet not been attained in existing SRAM based in-memory works.

Therefore, there is an unmet need for a novel approach using traditional SRAM memory cells that provide more robust approaches for dot product.

SUMMARY

A multi-bit dot product engine-based memory for carrying out vector-based dot products is disclosed. The engine includes a matrix of memory cells having M rows (M-1, M-2, ... 0) and N columns (N-1, N-2, ... 0), each memory cell (C) in each of the rows $((C_{N-1}, C_{N-2}, \ldots, C_0)_{M-1}, (C_{N-1}, C_{N-2}, \ldots, C_0)_{M-2}, \ldots (C_{N-1}, C_{N-2}, \ldots, C_0)_0)$ holding a value and having dedicated read transistors T1 and T2, where T1 is controlled by the value held in the associated memory cell and T2 is controlled by a row-dedicated read word line $RWL_i$ ($RWL_{M-1}$, $RWL_{M-2}$, ... $RWL_0$), the combination of the T1 and T2 transistors for each cell selectively (i) couple a row-dedicated source ($v_{in}$) for each row (($v_{in})_{M-1}$, $(v_{in})_{M-2}$, ... $(v_{in})_0$) with a column-dedicated read bit line (RBL) for each column ($RBL_{N-1}$, $RBL_{N-2}$, ... $RBL_0$) for an in-memory vector-based dot product operation or (ii) couple ground with the column-dedicated read bit line (RBL) for each column ($RBL_{N-1}$, $RBL_{N-2}$, ... $RBL_0$) for a memory read operation, where total resistance of the T1 and T2 transistors (R) for each cell ($R_{N-1}$, $R_{N-2}$, ..., $R_0$) in each row (M-1, M-2, ... 0) is based on $Rmax/2^{(M-1)}$, $Rmax/2^{(M-2)}$, ... Rmax, where Rmax is the resistance of the least significant cell in each row and where current in each RBL ($I_{RBL}$) for each column (($I_{RBL})_{N-1}$, $(I_{RBL})_{N-2}$, ... $(I_{RBL})_0$) is summed as $I_{out}$. The engine also includes a sensing circuit coupled to the matrix of memory cells and adapted to selectively (i) receive and convert the current $I_{out}$ to a digital value representing an output of the vector-based dot product, or (ii) sense voltage at each of the RBLs ($RBL_{N-1}$, $RBL_{N-2}$, ... $RBL_0$) to read value of the corresponding cells.

Another multi-bit dot product engine-based memory for carrying out vector-based dot products is also disclosed. The engine includes a matrix of memory cells having M rows (M-1, M-2, ... 0) and N columns (N-1, N-2, ... 0), each memory cell (C) in each of the rows $((C_{N-1}, C_{N-2}, \ldots, C_0)_{M-1}, (C_{N-1}, C_{N-2}, \ldots, C_0)_{M-2}, \ldots (C_{N-1}, C_{N-2}, \ldots, C_0)_0)$ holding a value and having dedicated read transistors T1 and T2, where T1 is controlled by the value held in the associated memory cell and T2 is controlled by a row-dedicated source ($v_{in}$) for each row (($v_{in})_{M-1}$, $(v_{in})_{M-2}$, ... $(v_{in})_0$), the combination of the T1 and T2 transistors for each cell selectively (i) couple a reference voltage ($V_{bias}$) with a column-dedicated read bit line (RBL) for each column ($RBL_{N-1}$, $RBL_{N-2}$, ... $RBL_0$) for an in-memory vector-based dot product operation or (ii) couple ground with the column-dedicated read bit line (RBL) for each column ($RBL_{N-1}$, $RBL_{N-2}$, ... $RBL_0$) for a memory read operation, where total resistance of the T1 and T2 transistors (R) for each cell ($R_{N-1}$, $R_{N-2}$, ..., $R_0$) in each row (M-1, M-2, ... 0) is based on $Rmax/2^{(M-1)}$, $Rmax/2^{(M-2)}$, ... Rmax, where Rmax is the resistance of the least significant cell in each row and where current in each RBL ($I_{RBL}$) for each column (($I_{RBL})_{N-1}$, $(I_{RBL})_{N-2}$, ... $(I_{RBL})_0$) is summed as $I_{out}$. The engine also includes a sensing circuit coupled to the matrix of memory cells and adapted to selectively (i) receive and convert the current $I_{out}$ to a digital value representing an output of the vector-based dot product, or (ii) sense voltage at each of the RBLs ($RBL_{N-1}$, $RBL_{N-2}$, ... $RBL_0$) to read value of the corresponding cells.

A method of obtaining an in-memory vector-based dot product is also disclosed. The method includes providing a matrix of memory cells having M rows (M-1, M-2, . . . 0) and N columns (N-1, N-2, . . . 0), each memory cell (C) in each of the rows (($C_{N-1}$, $C_{N-2}$, . . . , $C_0$)$_{M-1}$, ($C_{N-1}$, $C_{N-2}$, . . . , $C_0$)$_{M-2}$, . . . ($C_{N-1}$, $C_{N-2}$, . . . , $C_0$)$_0$) holding a value and having dedicated read transistors T1 and T2, where T1 is controlled by the value held in the associated memory cell and T2 is controlled by a row-dedicated source ($v_{in}$) for each row (($v_{in}$)$_{M-1}$, ($v_{in}$)$_{M-2}$, . . . ($v_{in}$)$_0$), the combination of the T1 and T2 transistors for each cell selectively (i) couple a reference voltage ($V_{bias}$) with a column-dedicated read bit line (RBL) for each column ($RBL_{N-1}$, $RBL_{N-2}$, . . . $RBL_0$) for an in-memory vector-based dot product operation or (ii) couple ground with the column-dedicated read bit line (RBL) for each column ($RBL_{N-1}$, $RBL_{N-2}$, . . . $RBL_0$) for a memory read operation, where total resistance of the T1 and T2 transistors (R) for each cell ($R_{N-1}$, $R_{N-2}$, . . . , $R_0$) in each row (M-1, M-2, . . . 0) is based on $Rmax/2^{(M-1)}$, $Rmax/2^{(M-2)}$, . . . Rmax, where Rmax is the resistance of the least significant cell in each row and where current in each RBL ($I_{RBL}$) for each column (($I_{RBL}$)$_{N-1}$, ($I_{RBL}$)$_{N-2}$, . . . ($I_{RBL}$)$_0$) is summed as $I_{out}$. The method also includes selectively (i) receiving and converting the current $I_{out}$ to a digital value representing an output of the vector-based dot product, or (ii) sensing voltage at each of the RBLs ($RBL_{N-1}$, $RBL_{N-2}$, . . . $RBL_0$) to read value of the corresponding cells.

BRIEF DESCRIPTION OF DRAWINGS

FIG. 9*b* is a schematic of a matrix of cell having rows and columns, according to the present disclosure, employing the Config-B configuration, wherein current from each column is summed to determine a resultant from a vector-based dot product based on an input voltage ($V_{in}$) and the value held in the corresponding memory cells, where each memory cell in each row is given a proportional weight.

DETAILED DESCRIPTION

Figure 1:
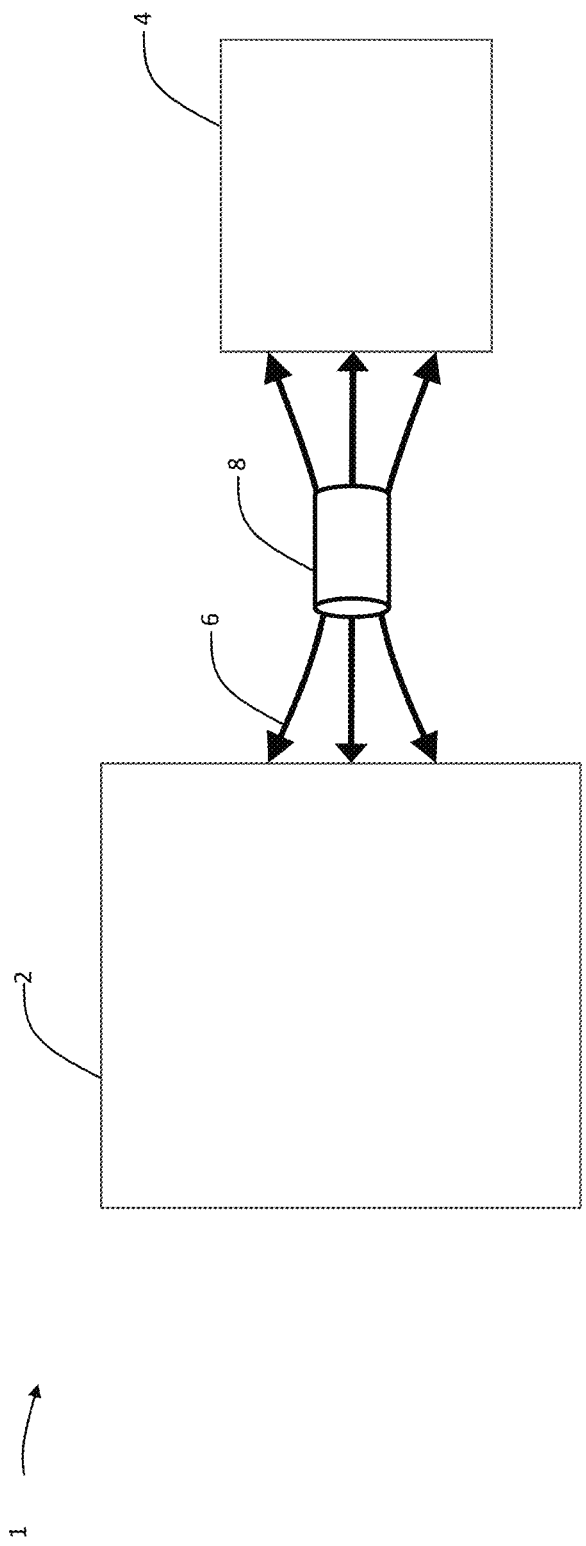
FIG. 1 is a schematic of a computing architecture according to the prior art.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

In the present disclosure terms switch and transistor are used interchangeably and are intended to refer to the same device.

Figure 2:
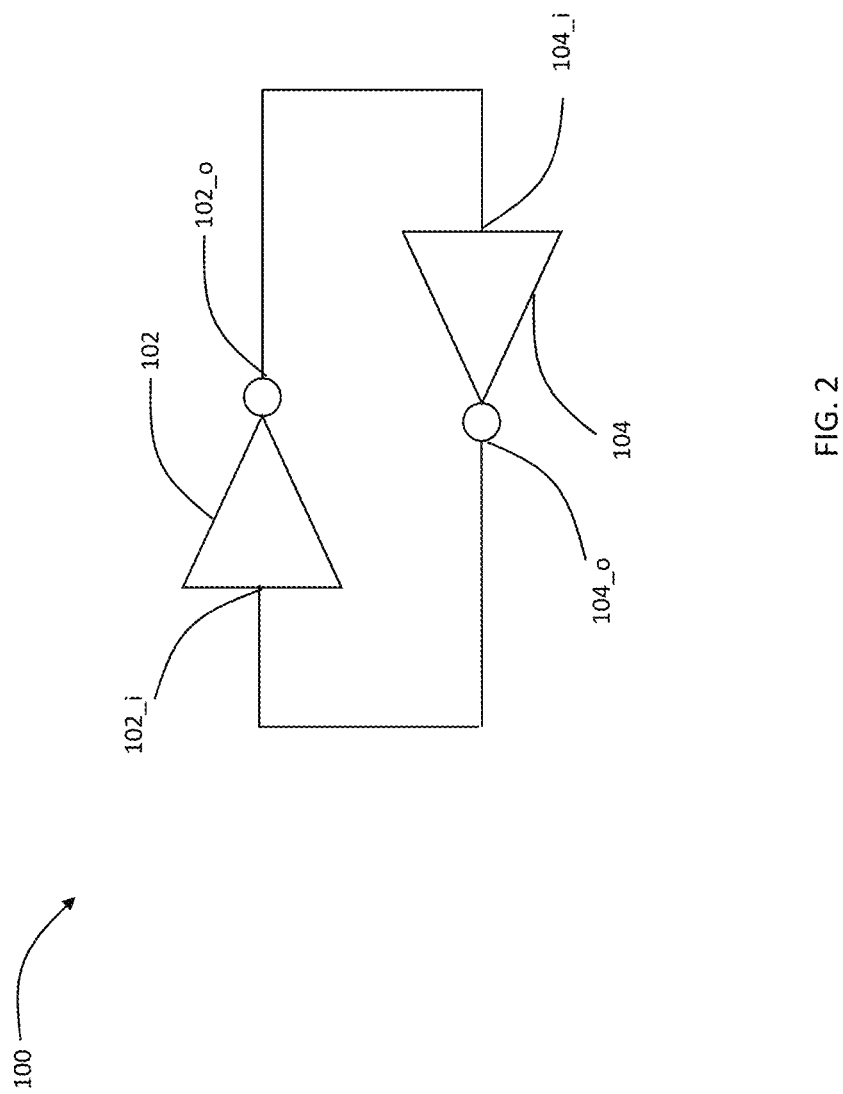
FIG. 2 is a generalized schematic of a memory cell.

A novel approach using traditional static read access memory (SRAM) cells that provide more robust approaches for dot product is provided in the present disclosure. An eight transistor (8T) SRAM topology is generally used, herein. Prior to describing operations of the 8T SRAM according to the present disclosure, operations of a simpler 6T SRAM cell is first described. Referring to FIG. 2, a simple schematic of a memory cell 100 is presented based on two back-to-back inverters 102 and 104. Input port of the inverter 102 is identified as 102_*i* while its output port is identified as 102_*o*. Similarly, input port of the inverter 104 is identified as 104_*i* while its output port is identified as 104_*o*. The output port 102_*o* is connected to input port 104_*i*, and the output port 104_*o* is connected to input port 102_*i*. Given the disposition of the two inverters 102 and 104, a value that is at the input port 102_*i* is maintained (hence, a memory cell). For example, if the memory cell 100 maintains a value of 0, which translates to a value of 0 at the input port 102_*i*, then the output port 102_0 has a value of 1, which is connected to the input port 104_*i*, which results in a value of 0 at the output port 104_*o*, which is connected to the input port 102_*i*, thereby maintaining the value 0 in the memory cell 100. Therefore, as long as the input port 102_*i* has a value of 0, that value is maintained.

Figure 3:
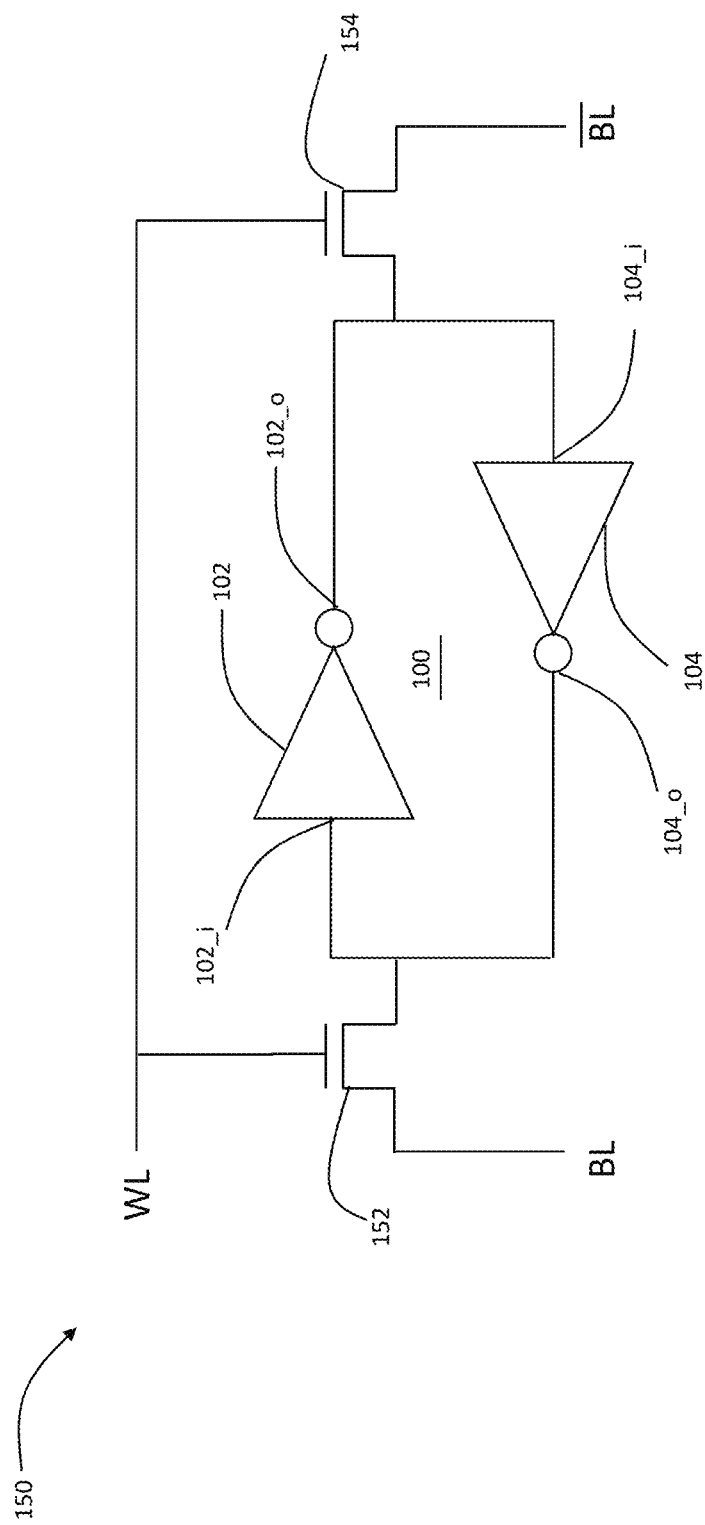
FIG. 3 is the generalized schematic of memory cell of FIG. 2 with access transistors.

Now referring to FIG. 3, a schematic of a memory cell 150 is shown which includes the memory cell 100 of FIG. 2 with access switches (or transistors) 152 and 154 designed to read values from and write values to the memory cell 100. Each switch 152 and 154 has a corresponding gate that is coupled to a word line (WL). When the WL is activated, the switches 152 and 154 are allowed to selectively read the value of the input ports 102_*i* and 104_*i*, or over-write those values.

Figure 4:
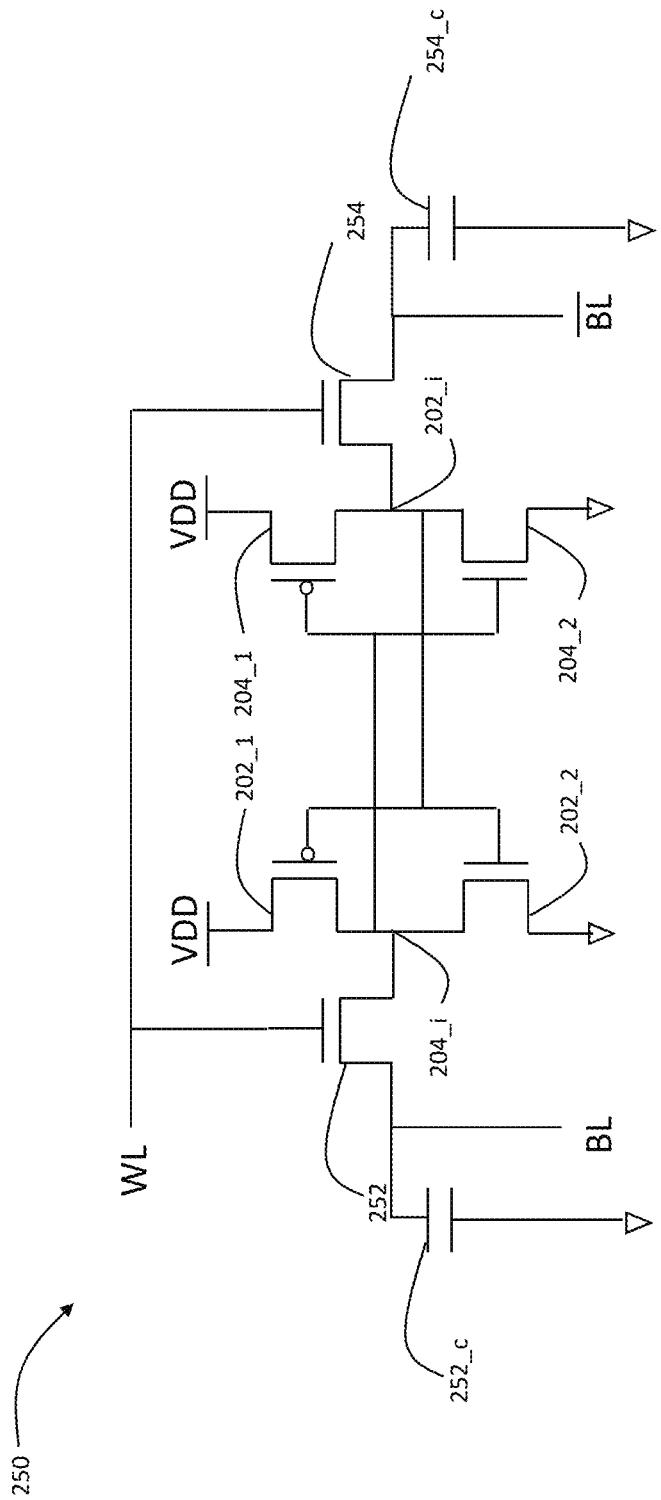
FIG. 4 is a transistor-based schematic of the memory cell of FIG. 3 depicting a six transistor SRAM.

To further demonstrate the operations of a standard 6T SRAM, refer to FIG. 4, in which a memory cell 250 is shown where the two transistors (or switches) 152 and 154 of FIG. 3 are shown as 252 and 254 and the two inverters 102 and 104 of FIG. 3 are each provided as two P and N transistors (shown as 202_1, 202_2, and 204_1, 204_2, respectively). The input port (or node) 102_*i* is now shown as 202_*i* and the input port (or node) 104 is now shown as 204_*i*. Furthermore, two capacitors 252_*c* and 254_*c*, each connected to a corresponding switches 252 and 254 are shown in FIG. 4 as pre-charge capacitors used to change values as discussed below. In the memory cell 250, the node 202_*i* is connected to the gates of transistors 202_1 and 202_2 and the node 204_*i* is connected to the gates of transistors 204_1 and 204_2.

The memory cell 250 of FIG. 4 is now described with respect to four operations: Read 0, Read 1, Write 0, and Write 1. For the Read 0 operation, suppose the node 202_*i* which is equivalent to the input port 102_*i* (see FIG. 2) is set to 0. In this case, since node 202_*i* is connected the gates of transistors 202_1 and 202_2, transistor 202_1 is turned on, while transistor 202_2 is off. This scenario causes node 204_*i* (which is the output of the inverter designated as 202_1 and 202_2) to be raised to VDD (i.e., the source of transistor 202_1). With node 204_*i* raised to VDD, since node 204_*i* is connected to the gates of transistors 204_1 and 204_2, transistor 204_1 is off while transistor 204_1 is turned on, thereby lowering node 202_*i* (i.e., the output of the inverter represented by transistors 204_1 and 204_2) to ground. This scheme is maintained until a new value is written to the memory cell 250, as discussed below. In order to read the value of the memory cell 250, pre-charge capacitors 252_*c* and 254_*c* are both charged to VDD and the line identified as WL is turned on, thereby turning on access transistors 252 and 254. In this scenario, lines BL and $\overline{BL}$ are treated as outputs. By pre-charging the two capacitors, 252_*c* and 254_*c*, the voltage at BL and $\overline{BL}$ start at VDD. In this case, since the node 204_*i* is at the same voltage as BL (i.e., at VDD), there is no change, however, node 202_*i* is at 0 and $\overline{BL}$ is at VDD, thus the voltage at the pre-charge capacitor 254_*c* begins to discharge through the transistor 204_2. By comparing the value of BL and $\overline{BL}$ using a sense amplifier, and seeing a decrease in BL as compared to BL, it can be deduced that the value of node 202_*i* (i.e., the value held in the memory cell 250) is 0. Conversely, if the value in the memory cell 250 is 1 (i.e., node 202_*i* is at VDD, node 204_*i* is at ground), pre-charging capacitors 252_*c* and 254_*c* to VDD will cause both node 202_*i* and BL to be at VDD while node 204_*i* is at ground (i.e., 0) and pre-charge capacitor 252_*c* (i.e., BL) is at VDD. This scenario causes the pre-charge capacitor 252_*c* to discharge. By comparing the value of BL and $\overline{BL}$ using a sense amplifier, and seeing a decrease in BL as compared to BL, it can be deduced that the value of node 202_*i* (i.e., the value held in the memory cell 250) is 1.

In contrast to the read operation, the write operation requires treatment of BL and $\overline{BL}$ as inputs (as compared to outputs, as in the case of reading the memory cell 250). This time suppose, the value at node 202_*i* is 1. By forcing BL to ground, the node 202_*i* begins to discharge from 1 to 0. When the voltage becomes smaller than the threshold voltage of the transistor 202_2, it will be turned off, and at the same time 202_1 is turned on, which raises the node 204_*i* to 1. By doing so, since the node 204_*i* is connected to the gates of the transistors 204_1 and 204_2, transistor 204_1 is turned off and transistor 204_2 is turned on. This situations results in the node 202_*i* to be at 0, which means the memory cell 250 has been successfully changed its value from a 1 to a 0.

In the read situation, however, there is a challenge with the 6T SRAM in which the voltage at the gate of transistors 202_2 or 204_2, as the pre-charge capacitors are being discharged may be high enough to unintentionally turn on these transistors. For example, in the case where node 204_*i* is a 0 and the pre-charge capacitors 252_*c* and 254_*c* are charged to VDD, then when WL is activated, it is possible that as the pre-charge capacitor 252_*c* is charging, the voltage at node 204_*i* (i.e., the same voltage at the gate for the transistor 204_2) may be higher than the threshold voltage of the transistor 204_2, which would unintentionally turn on that transistor causing node 202_*i* to also become 0, which is an unwanted condition since nodes 204_*i* and 202_*i* are intended to always be opposite one-another.

Figure 5:
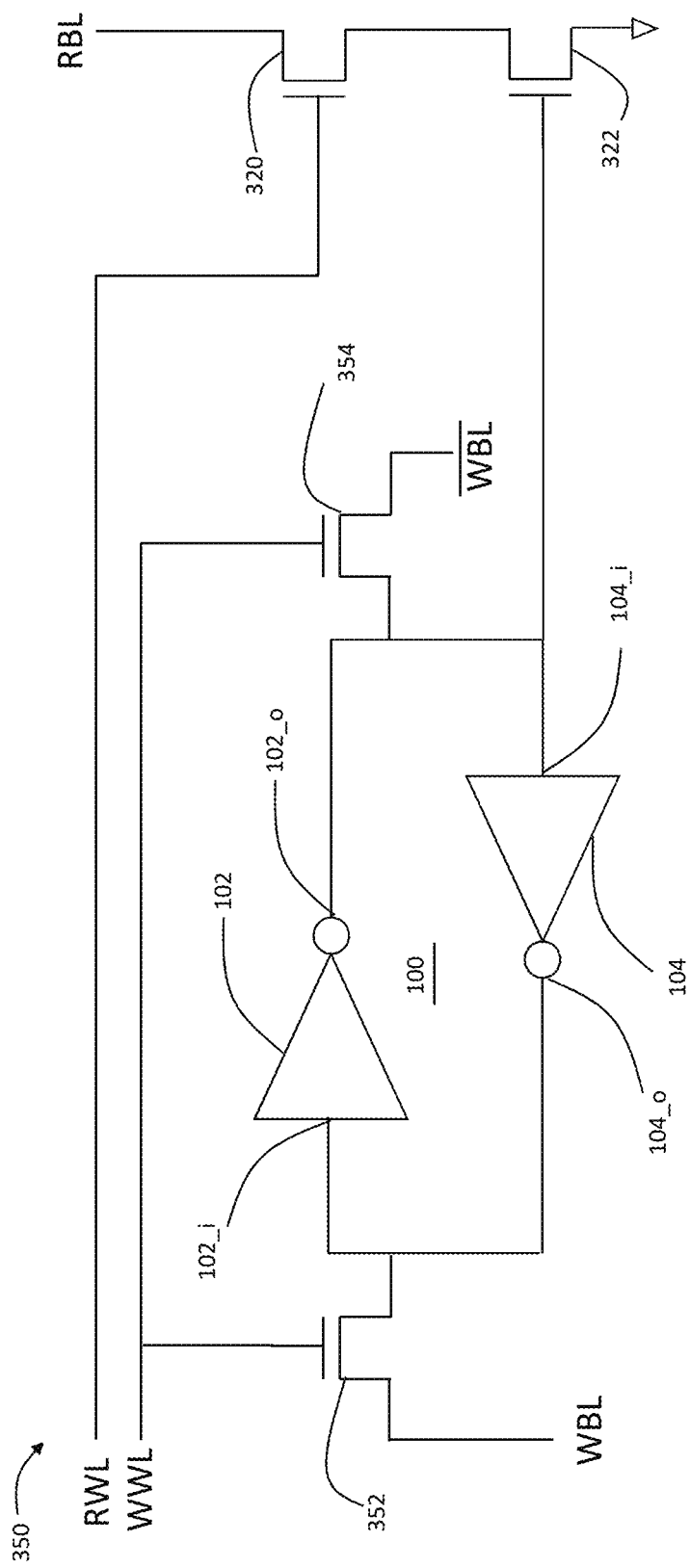
FIG. 5 is the generalized schematic of memory cell of FIG. 2 with dedicated read access transistors, depicting a generalized eight transistor (8T) SRAM.

This situation is typically called read-disturb failure. To overcome this unintended situations, the width of transistor 202_2 and 204_2 and 252 and 254 must be carefully chosen. Alternatively, the read and write operations can be decoupled in order to isolate the read operation. This alternative approach is known as the 8T SRAM with two additional transistors for said decoupling. Referring to FIG. 5, a schematic of an 8T SRAM 350 is provided which includes the memory cell 100 of FIG. 2 with access transistors (or switches) 352 and 354 designed to write values to the memory cell 100; and access transistors (or switches) 320 and 322 designed to read values from the memory cell 100. Each switch 352 and 354 has a corresponding gate that is coupled to a write word line (WWL), while switch has a gate coupled to a read word line (RWL) and switch 322 has a gate coupled to the input port 104_*i*. When WWL is activated, the switches 352 and 354 are allowed to over-write the value of the input ports 102_*i* and 104_*i*. Similarly, when RWL is activated, the switches 320 and 322 are allowed to read the value of the input port 104_*i*. One difference with the complementary FIG. 3 (depicting the 6T SRAM schematic) is that in FIG. 5 the BL lines are now WBL and $\overline{WBL}$ for write bit line and RBL for read bit line. Since the write and read are now decoupled, the robustness of the result 8T SRAM bit-cell is better that the 6T bit-cells in terms of read and write noise margins. Note, the source of transistor 322 is always connected to ground for 8T cells in prior-art, which as will be shown later represents one difference between the memory cell of the present disclosure and the memory cell used in the prior art.

Figure 6:
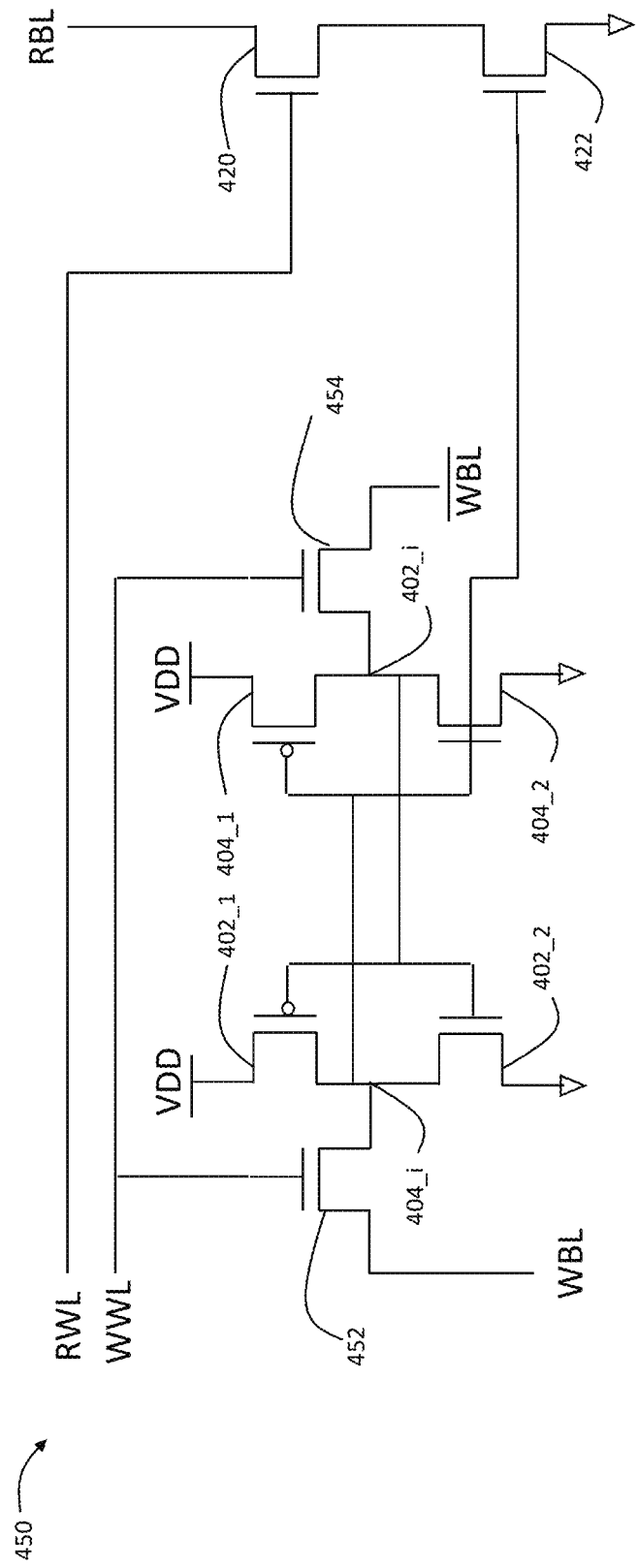
FIG. 6 is a transistor-based schematic of the memory cell of FIG. 5.

To further demonstrate the operations of an 8T SRAM, refer to FIG. 6, in which a memory cell 450 is shown where the four transistors (or switches) 352, 354, 320, and 322 of FIG. 5 are shown as 452, 454, 420, and 422, respectively, and the two inverters 102 and 104 of FIG. 5 are each provided as two P and N transistors (shown as 402_1, 402_2, and 404_1, 404_2, respectively). The input port 102_*i* is now shown as 402_i and the input port 104 is now shown as 404_i. In the memory cell 450, the node 402_i is connected to the gates of transistors 402_1 and 402_2 and the node 404_i is connected to the gates of transistors 404_1 and 404_2.

The 8T SRAM cell shown in FIG. 6 is more robust as compared to the 6T cells due to isolated read port (i.e., the transistors 420, 422 coupled to the RBL and RWL). According to the present disclosure, it is possible to configure the 8T cell SRAM for in-memory dot product computations. It should be noted that in sharp contrast to the previous works related to in-memory computing with the CMOS technology, according to the present disclosure, a current based, analog-like dot product computations is enabled using the robust digital 8T bit-cells.

In particular, in a typical 8T SRAM, in a read operation, the line identified as RBL is capacitively pre-charged to a high value (VDD), when RWL is activated (i.e., a high voltage placed on RWL) and the source of the transistor 422 is connected to ground, if a value "0" is held in the memory cell, then the transistor 422 remains in the off state, thereby the voltage at the drain of the transistor 422 remains at high which indicates a "0" in the cell. If however, the memory cell has a "1", then the transistor 422 is turned on, thereby the voltage at the drain of the transistor 422 discharges to ground through the transistor 422 which indicates a "1" in the cell. In either of these cases, the topology for a typical 8T SRAM is based on changes of voltage (no change at the drain of the transistor 422, indicating a "0" in the cell, and a reduction from a high voltage to about 0 indicating a "1" in the cell), with little or no current passing through the output transistors 420 and 422.

Configuring an 8T SRAM cell in particular configurations, according to the present disclosure and as described below allows a network of these cells to be used as a multi-bit dot product engine. In one embodiment, in these configurations, the determination of whether the cell stores a "1" or a "0" is not based on resultant voltage on the RBL but based on currents flowing through the RBL. A dot product here refers to a vector-based dot product summation of products of two vector components. For example, a vector v, having components $v_0, v_1, v_2, v_3 \ldots$ can be applied to a vector w having components $w_0, w_1, w_2, w_3, \ldots$ in a dot product operation resulting in Y which is a scalar with a value of $v_0 \cdot w_0 + v_1 \cdot w_1 + v_2 \cdot w_2 + v_3 \cdot w_3 + \ldots$. In a matrix, each w can be held in a row of cells, and $v_i$ can be applied to each row, with the currents from each of the rows summed to obtain the resultant. For example, if $w_0$ is a 4-bit word, then four cells in the same row can be used to store $w_0$. More on the dot product will be provided later in the present disclosure.

It should be appreciated that the in-memory dot product operation is a particular implementation of the 8T SRAM, in which the source lines of the access transistor T1 is coupled to $v_i$ or $V_{bias}$ (as described below) depending on which of the below-described two configurations is chosen and the current through RBL is sensed. However, for a typical memory operation, the source lines are coupled to ground and the voltage at RBL is sensed as described above to read the cell values.

Figure 7:
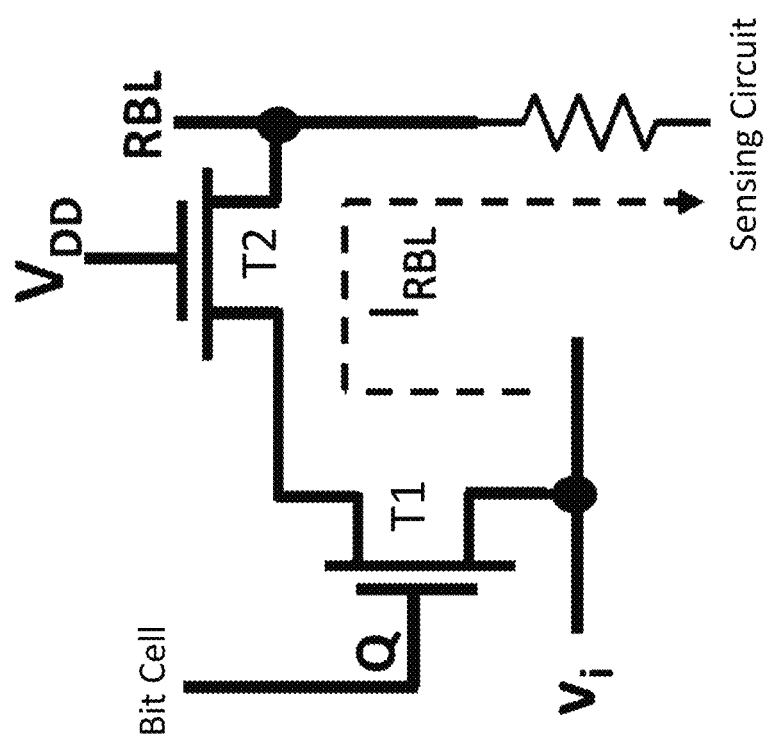
FIG. 7 is a schematic of a first configuration (Config-A) modifying the dedicated read access transistors of the 8T SRAM of FIG. 6, according to the present disclosure.
Figure 8:
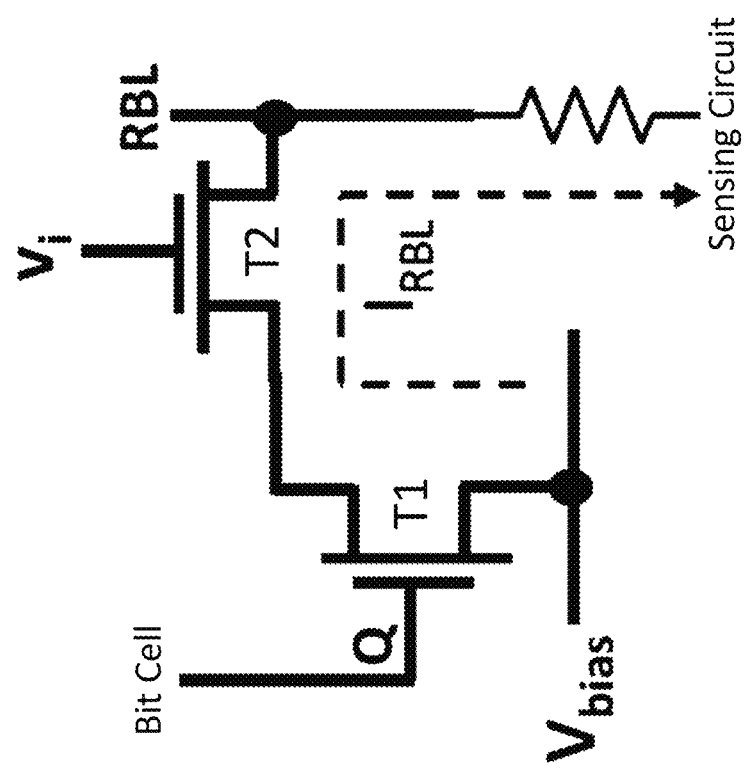
FIG. 8 is a schematic of a second configuration (Config-B) modifying the dedicated read access transistors of the 8T SRAM of FIG. 6, according to the present disclosure.

Two configurations—Config-A and Config-B are provided, according to the present disclosure, to convert the 8T SRAM from a voltage-based single memory readout cell to a current-based cell multi-bit dot product engine. Config-A is shown in FIG. 7 which shows a schematic of the first proposed configuration (Config-A) for implementing the dot product engine using the 8T-SRAM bit-cell. Comparing FIGS. 7 and 6, T1 and T2 in FIG. 7 correspond to the transistors 422 and 420, respectively, in FIG. 6. In the schematic of Config-A shown in FIG. 7, the source of transistor T1 is coupled to the input analog voltage $v_i$, and the RWL is activated. The current $I_{RBL}$ which runs through the RBL line is sensed which is proportional to the dot product $v_i \cdot g_i$, where $g_i$ as discussed above is the ON/OFF conductance of the transistors T1 and T2. While a sense resistor is shown in FIG. 7 as part of a sense circuit (or can be considered as the effective input resistance of the sensing-circuit), a number of current sensing approaches, known to a person having ordinary skill in the art are available. The second configuration (Config-B) is shown in FIG. 8, wherein the input analog voltage is applied to the gate of T2, while the source of transistor T2 is supplied with a constant voltage $V_{bias}$, thereby generating $I_{RBL}$, which is sensed in the same way as in Config-A.

In Config-A (FIG. 7), a static current flow from the $v_i$ to the RBL, exists which is controlled by the value of the bit held in the bit cell of the SRAM (i.e., a '1' or a '0'), where when the bit cell is '1', $I_{RBL}$ is proportional to the input $v_i$ and the conductance of the two transistors T1 and T2. If the bit-cell (see FIG. 6) stores '0', the transistor T1 is OFF, and the output current through the RBL is close to 0. Whereas if the bit-cell stores a '1', the current is proportional to $v_i \cdot g_{ON}$, where $g_{ON}$ is the series 'ON' conductance of the transistors T1 and T2. When placing the circuit in an array of cells, similar inputs $v_i$ are applied on the source lines of transistors T1 for each row of the memory array. Since the RBL is common throughout the column, the currents from all the inputs $v_i$ are summed into the RBL. Moreover, since the source line is common throughout each row, the same inputs $v_i$ are supplied to multiple columns. Thus, the final output current through RBL of each column is proportional to:

$$I^j_{RBL} = \Sigma(v_i \cdot g^j_i) \qquad (1)$$

where $g^j_i$ is the 'ON' or 'OFF' conductance of the transistors, depending on whether the bit-cell in the i-th row and j-th column stores a '1' or '0', respectively. The output current vector thus resembles the vector-matrix dot product, where the vector is $v_i$ in the form of input analog voltages and $g^j_i$, where $g^j_i$ stored as digital data in the SRAM.

Figure 9A:
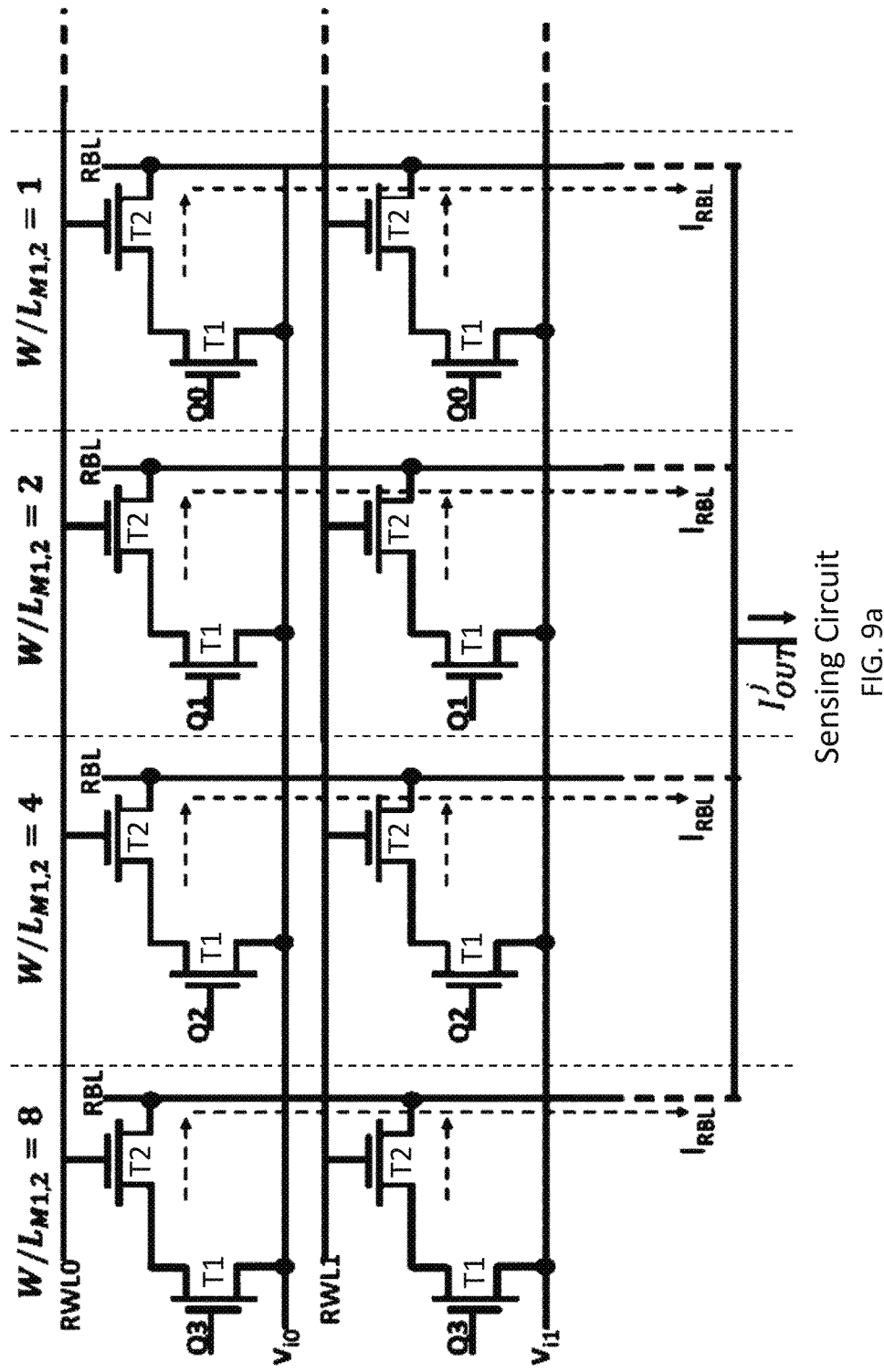
FIG. 9*a* is a schematic of a matrix of cell having rows and columns, according to the present disclosure, employing the Config-A configuration, wherein current from each column is summed to determine a resultant from a vector-based dot product based on an input voltage ($V_{in}$) and the value held in the corresponding memory cells, where each memory cell in each row is given a proportional weight.

To provide a clearer picture of the dot product in a matrix of cells, refer to FIG. 9a where a schematic of a 4-bit matrix is shown (note the write transistors and the transistors associated with 6T SRAM are not shown), based on Config-A (see FIG. 7). In the above-equation (Eq. 1), if conductance is replaced with weight ($w^j_i$s corresponding to weights of the $i^{th}$ row and $j^{th}$ column) these weights can be written as $W^j i = w^j_3 w^j_2 w^j_1 w^j_0$, resulting in the vector matrix dot product: $\Sigma(v_i \cdot W^j_i) = [v_i \cdot (2^3 w_3 + 2^2 w_2 + 2^1 w_1 + 2^0 w_0)]$ which translates to $\Sigma(v_i \cdot 2^3 w_3) + \Sigma(v_i \cdot 2^2 w_2) + \Sigma(v_i \cdot 2^1 w_1) + \Sigma(v_i \cdot 2^0 w_0)$ for column j. If the read transistors T1 and T2 of the SRAM bit-cells in column 1 through 4 are sized in the ratio $2^3 : 2^2 : 2^1 : 2^0$, as shown in FIG. 9a, the conductance of transistors in the 'ON' state would also be in the ratio $2^3 : 2^2 : 2^1 : 2^0$ associated with the columns.

Thus, summing the currents through the RBLs of the four columns yields the required dot product in accordance to the equation shown above. An example is now provided to better illustrate the dot product operation. Suppose, a first 4-bit vector $w_1$ held at a first row has a value of 1001 and its dot product with a vector $v_1$ is desired. Suppose further, a second 4-bit vector $w_1$ held at a second row has a value of 0110 and it's dot product with $v_1$ is also desired. From the above relationship we know that $v_1$ is applied to both the first row and the second row, however, in each row the overall resistance from T1 and T2 (see FIGS. 7 and 9a) changes from R/8 to R (R represents the overall resistance based on conductance of T1 and T2) where R is the total resistance of T1 and T2 of the least significant bit. Therefore, application of $v_1$ to each of the first and second rows (holding 1001 and 0110, respectively) results in a current of $1\times v_1/(R/2^3)+0\times v_1/(R/2^2)+0\times v_1/(R/2^1)+1\times v_1/(R/2^0)$ for the first row and $0\times v_1/(R/2^3)+1\times v_1/(R/2^2)+1\times v_1/(R/2^1)+0\times v_1/(R/2^0)$ for the second row, where for all rows, 8 ($2^3$) is the weight of the most significant bit, . . . and 1 ($2^0$) is the weight of the least significant bit. Rewriting these, the current from each row is $8v_1/R+1v_1/R$ (or $9v_1/R$) for the first row and $4v_1/R+2v_1/R$ (or $6v_1/R$) for the second row. Adding these will result in $15v_1/R$ which is in agreement with the dot product of $v_1$ with 1001 and 0110 (i.e., $v_1\cdot 1001+v_1\cdot 0100$) with unit R for the total resistance of T1 and T2.

This sizing pattern can be repeated throughout the array. In addition, one could also use transistors having different threshold voltages to mimic the required ratio of conductances as $2^3:2^2:2^1:2^0$. Thus, affecting conductance or threshold voltages can be used to make the needed ratios. It should be noted that the currents through the RBLs of the four consecutive columns are summed together, thus we obtain one analog output current value for every group of four columns. In other words, the digital 4-bit word stored in the SRAM array is multiplied by the input voltage $v_i$ and summed up by analog addition of the currents on the RBLs. This one-go computation of vector multiplication and summation in a digital memory array would result in high throughput computations of the dot products.

Referring to FIG. 9b, the schematic of FIG. 9a is shown for CONIG-B, where the sources of T1 transistors is coupled to a reference voltage ($V_{bias}$) that can be a global reference voltage and the gates of transistors T2 is coupled to $V_{in}$. $I_{OUT}$ represents an analog output of the vector-based dot product according to the present disclosure for Config-B.

It should also be noted that the static current flowing through the ON transistors T1 and T2 of the present disclosure would typically be much higher as compared to memristor topology known to a person having ordinary skills in the art. In order to reduce the static current flow, the supply voltage of the SRAM cell can be scaled down. In this regard, it should be noted that in 8T cells these are known to retain their robust operation even at highly scaled supply voltages.

In the yet another approach to reduce the static current, a VDD lower than a nominal VDD of 1V is used as discussed with respect to CONFIG-B (see FIG. 8). With reference to FIG. 8, the source of each T1 are coupled to a constant voltage $V_{bias}$. The input vector $v_i$ is coupled to RWLs, i.e., the gate of T2. Similar to Config-A (see FIG. 7), the output current $I_{RBL}$ is proportional to $v_i$. We will later show from our simulations that for a certain range of input voltage values, a linear relationship between $I_{RBL}$ and $v_i$ is obtained, which can be exploited to calculate the approximate dot product. To implement multi-bit precision, the transistor sizing is accomplished in the same way as Config-A (see FIG. 9a), so that the $I_{RBL}$ is directly proportional to the transistor conductances. Key features of the proposed Config-B are as follows. $V_{bias}$ can be adjusted to reduce the current flowing through the RBLs. The input voltages $v_i$ have a capacitive load, as opposed to a resistive load in Config-A (see FIG. 7). This relaxes the constraints on the input voltage generator circuitry, and is useful while cascading two or more stages of the dot product engine. However, as discussed below, Config-B (see FIG. 8) has a small non-zero current corresponding to zero input as compared to Config. A (see FIG. 7) that has substantially zero current for zero input.

In order to sense the output current at the RBLs, a current to voltage converter can be used. This can most simply be a resistor, as shown in FIGS. 7 and 8. However, there are a few constraints. As the output current increases, the voltage drop across the output resistor increases, which in turn changes the desired current output. A change in the voltage on the RBL would also change the voltage across the transistors T1 and T2, thereby making their conductance a function of the voltage on the RBL. Thus, at higher currents corresponding to multiple rows of the memory array, the $I_{RBL}$ does not approximate the vector-matrix dot product, but deviates from the ideal output. This dependence of the RBL voltage on the current $I_{RBL}$ is further discussed below with different approaches.

Figures 10A, 10B, 10C:
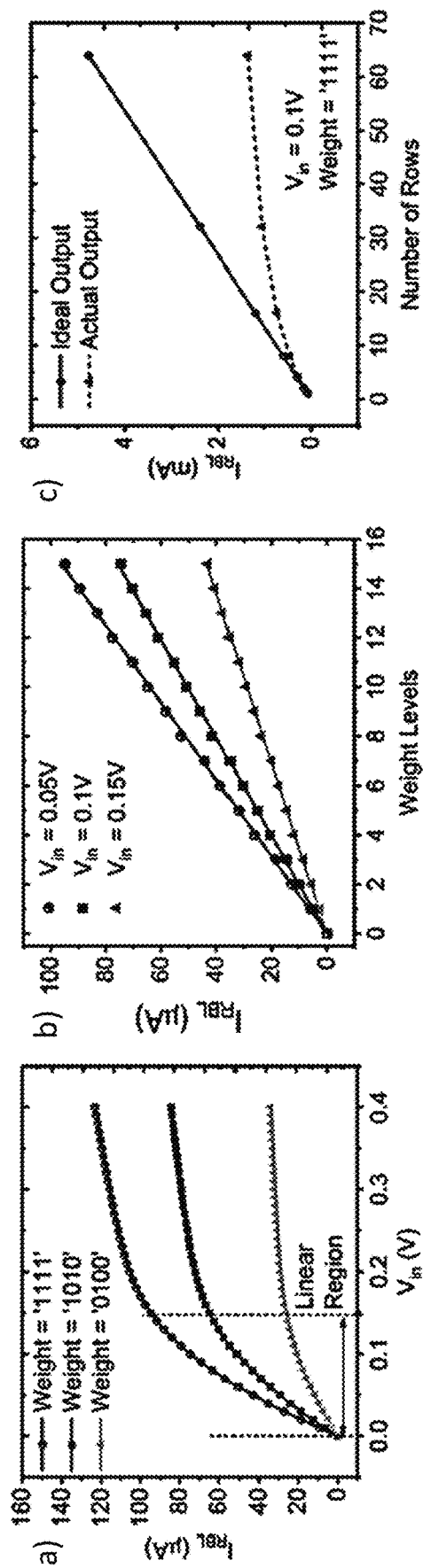
FIG. 10*a* is a graph of the summed current of FIG. 9*a* vs. $V_{in}$.
FIG. 10*b* is a graph of the summed current of FIG. 9*a* vs. the corresponding proportional weights.
FIG. 10*c* is a graph of the summed current of FIG. 9*a* vs. the number of rows.
Figures 11A, 11B, 11C:
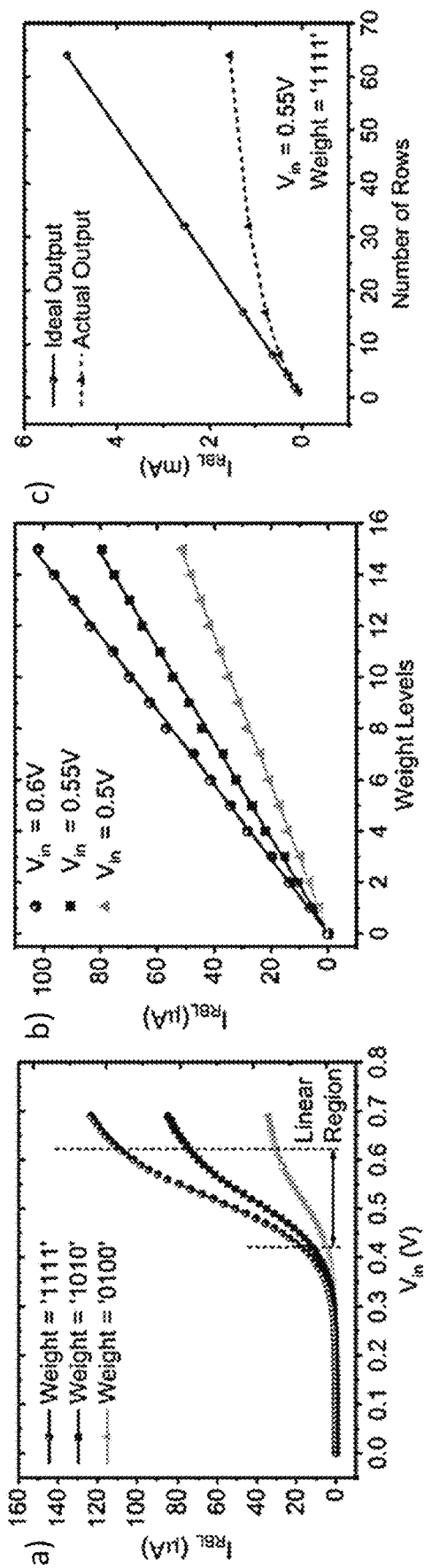
FIG. 11*a* is a graph of the summed current of FIG. 9*b* vs. $V_{in}$.
FIG. 11*b* is a graph of the summed current of FIG. 9*b* vs. the corresponding proportional weights.
FIG. 11*c* is a graph of the summed current of FIG. 9*b* vs. the number of rows.

The operation of the proposed configurations (Config-A (see FIG. 7) and Config-B (see FIG. 8)) for implementing a multi-bit dot product engine was simulated using HSPICE on the 45 nm PTM technology. For the entire analysis, a scaled down VDD of 0.65V for the SRAM cells was chosen. The main components of the dot-product engine implementation are the input voltages and conductances of the transistors for different states of the cells. A summary of the analysis for the two configurations is presented in FIGS. 10a, 10b, and 10c for Config-A (see also FIG. 7), and FIGS. 11a, 11b, and 11c for Config-B (see also FIG. 8). FIGS. 10a and 11a show $I_{RBL}$ in μA vs. $V_{in}$ in volts for different weights (1111, 1010, and 0100). FIGS. 10b and 11b show $I_{RBL}$ in μA vs. weight levels (from 0 to 15) for $V_{in}$ of 0.05, 0.1, and 0.15V for Config-A (see also FIG. 7), and for $V_{in}$ of 0.6, 0.55, and 0.5V for Config-B (see also FIG. 8), showing a linear relationship between $I_{RBL}$ and weight levels at various voltage levels. FIGS. 10c and 11c show $I_{RBL}$ in mA vs. number of rows from 1 to 65 for $V_{in}$ of 0.1 V and weight of 1111 for Config-A (see also FIG. 7) and for $V_{in}$ of 0.55 V and weight of 1111 for Config-B (see also FIG. 8), showing a significant deviation from ideal output ($I_N=N\times I_1$ with increasing number of rows for both, where $I_1$ is the current corresponding to one row and N is the number of rows). In all these figures, a sensing resistance of 50-ohms connected to the RBL is used, however, as discussed above, other techniques besides a sense resistor (e.g., an op-amp with a comparator) can also be used to sense current. It should be noted that a small sense resistance is required to ensure that the voltage across the sensing resistance is not high enough to drastically alter the conductances of the connected transistors T1 and T2.

In FIGS. 10a and 11a, results presented are for a single 4-bit cell. To preserve the accuracy of a dot-product operation, it is advantageous to operate the cell in the voltage ranges such that the current is a linear function of the applied voltage $v_i$. These voltage ranges are marked as linear region in FIGS. 10a and 11a. The slope of the linear section $I_{RBL}$ versus $V_{in}$ plot varies with weight, thus signifying a dot product operation. Further, at the left voltage extremity of the linear region, $I_{RBL}$ tends to zero irrespective of the weight, thus satisfying the constraint that the output current is zero for zero $V_{in}$. It is to be noted that the two configurations show significantly different characteristics due to the different point-of-application of input voltages.

In FIGS. 10b and 11b, results from the dependence of the current $I_{RBL}$ on the 4-bit weight levels for Config-A at constant voltages $V_{in}$=0.05V, 0.1V, 0.15V and configuration B at $V_{in}$=0.5V, 0.55V, 0.6V, respectively, are provided. Different voltages were chosen so as to ensure the circuit operates in the linear region as depicted by FIGS. 10a and 11a. Desirably, $I_{RBL}$ shows a linear dependence on weight levels and tends to zero out for weight='0000'. The choice of any voltage in the linear regions of FIGS. 10a and 11a does not alter the linear dependence of the $I_{RBL}$ on weight levels.

To expand the dot-product functionality to multiple rows, an analysis for up to 64 rows in the SRAM array was also performed, driven by 64 input voltages. In the worst case condition, when the 4-bit weight stores '1111', maximum current flows through the RBLs, thereby increasing the voltage drop across the output resistance. In FIGS. 10c and 11c, the total current $I_{RBL}$ indicates to deviate from its ideal value with increasing number of rows, in the worst case condition. The deviation in these figures (FIGS. 10c and 11c) is because the output current is sensed with an equivalent sensing resistance ($R_{sense}$) and hence the final voltage on the bit-line ($V_{BL}$) is dependent on the current $I_{RBL}$. At the same time, $I_{RBL}$ is also dependent on $V_{BL}$ and as a result the effective conductance of the cell varies as $V_{BL}$ changes as a function of the number of rows. It was also observed that the deviation reduces with decreasing sensing resistance as expected. The total summed up current reaches almost 6 mA for 64 rows for the worst case condition (all the weights are '1111').

Figure 13:
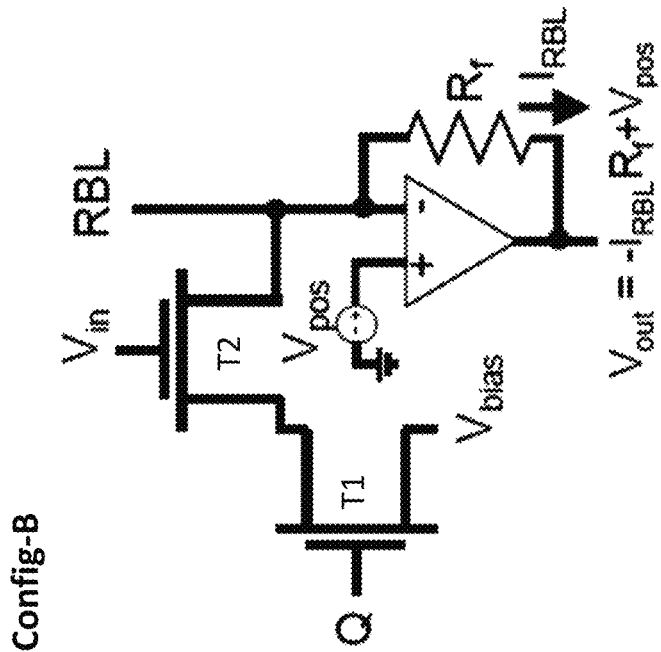
FIG. 13 is a schematic of a sensing circuit for Config-B, according to the present disclosure utilizing an Opamp.
Figure 12:
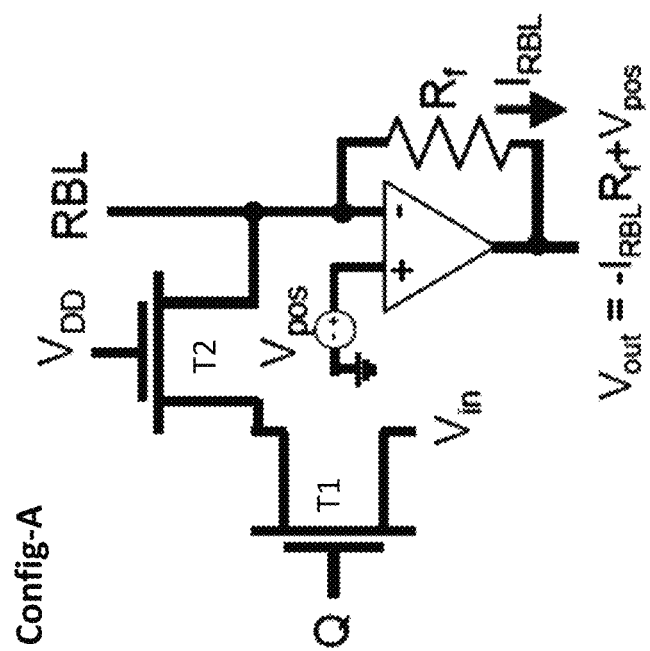
FIG. 12 is a schematic of a sensing circuit for Config-A, according to the present disclosure utilizing an operational amplifier (Opamp).
Figures 14A, 14B, 14C:
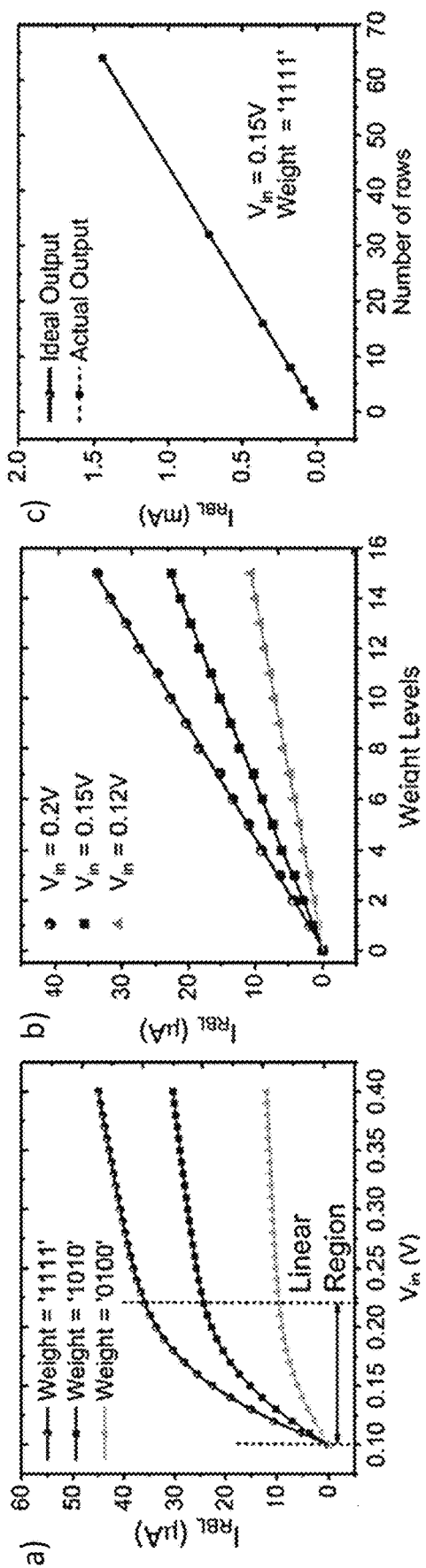
FIG. 14*a* is a graph of the summed current of FIG. 9*a* vs. $V_{in}$ utilizing the sensing circuit of FIG. 12.
FIG. 14*b* is a graph of the summed current of FIG. 9*a* vs. the corresponding proportional weights utilizing the sensing circuit of FIG. 12.
FIG. 14*c* is a graph of the summed current of FIG. 9*a* vs. the number of rows utilizing the sensing circuit of FIG. 12.
Figures 15A, 15B, 15C:
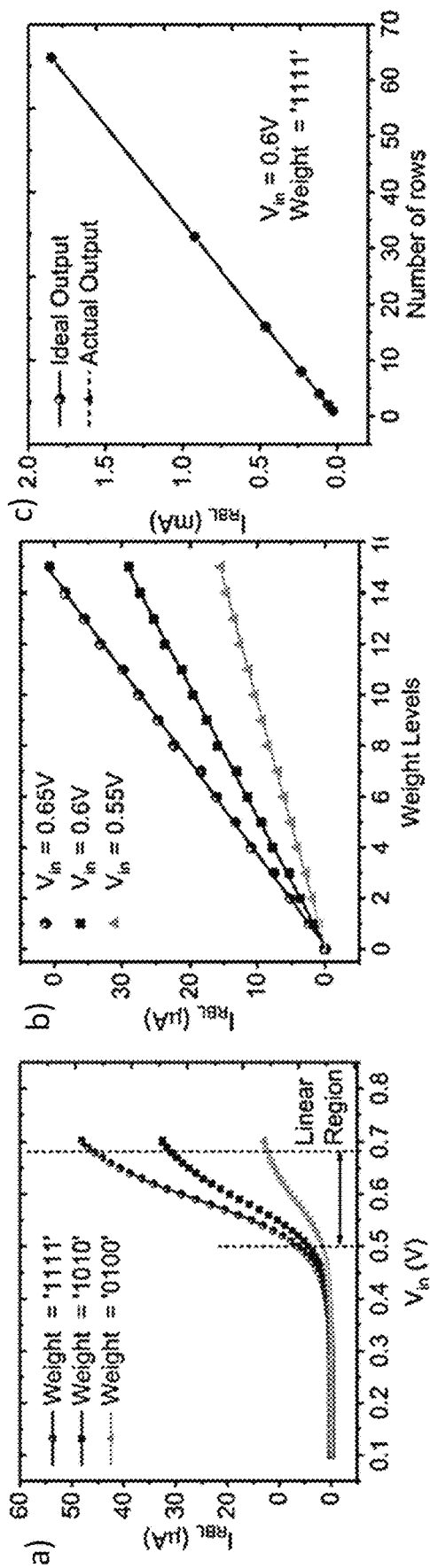
FIG. 15*a* is a graph of the summed current of FIG. 9*b* vs. $V_{in}$ utilizing the sensing circuit of FIG. 13.
FIG. 15*b* is a graph of the summed current of FIG. 9*b* vs. the corresponding proportional weights utilizing the sensing circuit of FIG. 13.
FIG. 15*c* is a graph of the summed current of FIG. 9*b* vs. the number of rows utilizing the sensing circuit of FIG. 13.

There are several ways to circumvent the deviation from ideal behavior with increasing number of simultaneous row accesses and also reduce the maximum current flowing through the RBLs. One possibility is to use an operational amplifier (Opamp) at the end of each 4-bit column, where the negative differential input of the Opamp is fed by the bit-line corresponding to a particular column. FIGS. 12 and 13 show schematics of these Opamps for Config-A and Config-B, respectively. The positive input of the Opamps are supplemented by a combination of the Opamp offset voltage and any desired voltage required for suitable operation of the dot-product as shown in FIGS. 12 and 13. Opamp provides capability of sensing the summed up current at the RBL while maintaining a constant voltage at the RBL The same analysis as discussed above for the case of no Opamp (see FIGS. 10a-10c and 11a-11c) for Config-A and Config-B was repeated but this time with the bitline terminated by associated Opamps. For this analysis, $V_{pos}$ was set to 0.1 V for the positive input of the Opamp and thus analysis is limited to input voltages above $V_{pos}$ to maintain the unidirectional current. It should be noted that ideal Opamps were considered for these simulations, where the voltage $V_{pos}$ can be accounted for both the non-ideal offset voltage of the Opamp and a combination of an externally supplied voltage. In FIGS. 14a and 15a, plots of $I_{RBL}$ versus input voltage $V_{in}$ for the two configurations, are provided. Similar behavior is seen as in the case of no Opamp (see FIGS. 10a and 11a). However, it should be noted that the current ranges have decreased since RBL is now clamped at $V_{pos}$. Further, the dot-product operation is only valid for $V_{in} > V_{pos}$ and thus the acceptable input range is shifted in the presence of an Opamp. FIGS. 14b and 15b show the behavior of $I_{RBL}$ versus weight levels for the two configurations and desirably, linearity is preserved.

FIGS. 14c and 15c show the current through the RBL as a function of the number of rows. As expected, due to the high input impedance of the Opamp, and the clamping of $V_{BL}$ at voltage $V_{pos}$ the deviation of the summed up current from the ideal value have been mitigated to a large extent. Although, the current levels have reduced significantly as compared to the FIGS. 10c and 11c, the resultant current for 64 rows would still be higher than the electro-migration limit for the metal lines constituting the RBL. According to one embodiment, access is made sequentially to a smaller section of the crossbar (e.g., 16 rows at a time), convert the analog current into its digital counterpart each time and finally add all accumulated digital results. In addition use of high threshold transistors for the read port of the SRAM would also help to reduce the maximum current values. Further, the maximum current is obtained only when all the weights are '1111', which is usually not true due to the sparsity of matrices involved in various applications.

Those having ordinary skill in the art will recognize that numerous modifications can be made to the specific implementations described above. The implementations should not be limited to the particular limitations described. Other implementations may be possible.

The invention claimed is:

1. A multi-bit dot product engine-based memory for carrying out vector-based dot products, comprising:
a matrix of memory cells having M rows (M-1, M-2, ... 0) and N columns (N-1, N-2, ... 0), each memory cell (C) in each of the rows (($C_{N-1}$, $C_{N-2}$, ..., $C_0$)$_{M-1}$, ($C_{N-1}$, $C_{N-2}$, ..., $C_0$)$_{M-2}$, ... ($C_{N-1}$, $C_{N-2}$, ..., $C_0$)$_0$) holding a value and having dedicated read transistors T1 and T2, where T1 is controlled by the value held in the associated memory cell and T2 is controlled by a row-dedicated read word line $RWL_i$ ($RWL_{M-1}$, $RWL_{M-2}$, ... $RWL_0$), the combination of the T1 and T2 transistors for each cell selectively (i) couple a row-dedicated source ($v_{in}$) for each row (($v_{in}$)$_{M-1}$, ($v_{in}$)$_{M-2}$, ... ($v_{in}$)$_0$) with a column-dedicated read bit line (RBL) for each column ($RBL_{N-1}$, $RBL_{N-2}$, ... $RBL_0$) for an in-memory vector-based dot product operation or (ii) couple ground with the column-dedicated read bit line (RBL) for each column ($RBL_{N-1}$, $RBL_{N-2}$, ... $RBL_0$) for a memory read operation, where total resistance of the T1 and T2 transistors (R) for each cell ($R_{N-1}$, $R_{N-2}$, ..., $R_0$) in each row (M-1, M-2, ... 0) is based on Rmax/$2^{(M-1)}$, Rmax/$2^{(M-2)}$, ... Rmax, where Rmax is the resistance of the least significant cell in each row and where current in each RBL ($I_{RBL}$) for each column (($I_{RBL}$)$_{N-1}$, ($I_{RBL}$)$_{N-2}$, ... ($I_{RBL}$)$_0$) is summed as $I_{out}$; and
a sensing circuit coupled to the matrix of memory cells and adapted to selectively (i) receive and convert the current $I_{out}$ to a digital value representing an output of the vector-based dot product, or (ii) sense voltage at each of the RBLs ($RBL_{N-1}$, $RBL_{N-2}$, ... $RBL_0$) to read value of the corresponding cells.

2. The multi-bit dot product engine-based memory of claim 1, wherein the sensing circuit is based on a sense resistor generating an analog voltage and an analog-to-digital converter generating a digital representation of the analog voltage.

3. The multi-bit dot product engine-based memory of claim 1, wherein the sensing circuit includes an operational amplifier (op-amp) generating an analog voltage and an analog-to-digital converter generating a digital representation of the analog voltage.

4. The multi-bit dot product engine-based memory of claim 3, wherein the op-amp receives the analog current $I_{out}$ at its negative terminal, a reference voltage ($V_{pos}$) at its positive terminal and a feedback resistor $R_f$ between its output and the negative terminal, wherein the op-amp's output is Vout=$-I_{out} \cdot R_f + V_{pos}$.

5. The multi-bit dot product engine-based memory of claim 1, wherein R is adjusted for each cell based on adjusting conductances of corresponding T1 and T2.

6. The multi-bit dot product engine-based memory of claim 5, wherein the conductances are adjusted for each cell based on adjusting threshold voltages of corresponding T1 and T2.

7. The multi-bit dot product engine-based memory of claim 5, wherein the conductances are adjusted for each cell based on adjusting sizes of corresponding T1 and T2.

8. A multi-bit dot product engine-based memory for carrying out vector-based dot products, comprising:
a matrix of memory cells having M rows (M-1, M-2, ... 0) and N columns (N-1, N-2, ... 0), each memory cell (C) in each of the rows (($C_{N-1}$, $C_{N-2}$, ..., $C_0$)$_{M-1}$, ($C_{N-1}$, $C_{N-2}$, ..., $C_0$)$_{M-2}$, ... ($C_{N-1}$, $C_{N-2}$, ..., $C_0$)$_0$) holding a value and having dedicated read transistors T1 and T2, where T1 is controlled by the value held in the associated memory cell and T2 is controlled by a row-dedicated source ($v_{in}$) for each row (($v_{in}$)$_{M-1}$, ($v_{in}$)$_{M-2}$, ... ($v_{in}$)$_0$), the combination of the T1 and T2 transistors for each cell selectively (i) couple a reference voltage ($V_{bias}$) with a column-dedicated read bit line (RBL) for each column ($RBL_{N-1}$, $RBL_{N-2}$, ... $RBL_0$) for an in-memory vector-based dot product operation or (ii) couple ground with the column-dedicated read bit line (RBL) for each column ($RBL_{N-1}$, $RBL_{N-2}$, ... $RBL_0$) for a memory read operation, where total resistance of the T1 and T2 transistors (R) for each cell ($R_{N-1}$, $R_{N-2}$, ..., $R_0$) in each row (M-1, M-2, ... 0) is based on $Rmax/2^{(M-1)}$, $Rmax/2^{(M-2)}$, ... Rmax, where Rmax is the resistance of the least significant cell in each row and where current in each RBL ($I_{RBL}$) for each column (($I_{RBL}$)$_{N-1}$, ($I_{RBL}$)$_{N-2}$, ... ($I_{RBL}$)$_0$) is summed as $I_{out}$; and
a sensing circuit coupled to the matrix of memory cells and adapted to selectively (i) receive and convert the current $I_{out}$ to a digital value representing an output of the vector-based dot product, or (ii) sense voltage at each of the RBLs ($RBL_{N-1}$, $RBL_{N-2}$, ... $RBL_0$) to read value of the corresponding cells.

9. The multi-bit dot product engine-based memory of claim 8, wherein the sensing circuit is based on a sense resistor generating an analog voltage and an analog-to-digital converter generating a digital representation of the analog voltage.

10. The multi-bit dot product engine-based memory of claim 8, wherein the sensing circuit includes an operational amplifier (op-amp) generating an analog voltage and an analog-to-digital converter generating a digital representation of the analog voltage.

11. The multi-bit dot product engine-based memory of claim 10, wherein the op-amp receives the analog current $I_{out}$ at its negative terminal, a reference voltage ($V_{pos}$) at its positive terminal and a feedback resistor $R_f$ between its output and the negative terminal, wherein the op-amp's output is $Vout=-I_{out} \cdot R_f + V_{pos}$.

12. The multi-bit dot product engine-based memory of claim 8, wherein R is adjusted for each cell based on adjusting conductances of corresponding T1 and T2.

13. The multi-bit dot product engine-based memory of claim 12, wherein the conductances are adjusted for each cell based on adjusting threshold voltages of corresponding T1 and T2.

14. The multi-bit dot product engine-based memory of claim 12, wherein the conductances are adjusted for each cell based on adjusting sizes of corresponding T1 and T2.

15. A method of obtaining an in-memory vector-based dot product, comprising:
providing a matrix of memory cells having M rows (M-1, M-2, ... 0) and N columns (N-1, N-2, ... 0), each memory cell (C) in each of the rows (($C_{N-1}$, $C_{N-2}$, ..., $C_0$)$_{M-1}$, ($C_{N-1}$, $C_{N-2}$, ..., $C_0$)$_{M-2}$, ... ($C_{N-1}$, $C_{N-2}$, ..., $C_0$)$_0$) holding a value and having dedicated read transistors T1 and T2, where T1 is controlled by the value held in the associated memory cell and T2 is controlled by a row-dedicated source ($v_{in}$) for each row (($v_{in}$)$_{M-1}$, ($v_{in}$)$_{M-2}$, ... ($v_{in}$)$_0$), the combination of the T1 and T2 transistors for each cell selectively (i) couple a reference voltage ($V_{bias}$) with a column-dedicated read bit line (RBL) for each column ($RBL_{N-1}$, $RBL_{N-2}$, ... $RBL_0$) for an in-memory vector-based dot product operation or (ii) couple ground with the column-dedicated read bit line (RBL) for each column ($RBL_{N-1}$, $RBL_{N-2}$, ... $RBL_0$) for a memory read operation, where total resistance of the T1 and T2 transistors (R) for each cell ($R_{N-1}$, $R_{N-2}$, ..., $R_0$) in each row (M-1, M-2, ... 0) is based on $Rmax/2^{(M-1)}$, $Rmax/2^{(M-2)}$, ... Rmax, where Rmax is the resistance of the least significant cell in each row and where current in each RBL ($I_{RBL}$) for each column (($I_{RBL}$)$_{N-1}$, ($I_{RBL}$)$_{N-2}$, ... ($I_{RBL}$)$_0$) is summed as $I_{out}$; and
selectively (i) receiving and converting the current $I_{out}$ to a digital value representing an output of the vector-based dot product, or (ii) sensing voltage at each of the RBLs ($RBL_{N-1}$, $RBL_{N-2}$, ... $RBL_0$) to read value of the corresponding cells.

16. The method of claim 15, wherein the sensing circuit is based on a sense resistor generating an analog voltage and an analog-to-digital converter generating a digital representation of the analog voltage.

17. The method of claim 15, wherein the sensing circuit includes an operational amplifier (op-amp) generating an analog voltage and an analog-to-digital converter generating a digital representation of the analog voltage.

18. The method of claim 17, wherein the op-amp receives the analog current $I_{out}$ at its negative terminal, a reference voltage ($V_{pos}$) at its positive terminal and a feedback resistor $R_f$ between its output and the negative terminal, wherein the op-amp's output is $Vout=-I_{out} \cdot R_f + V_{pos}$.

19. The method of claim 15, wherein R is adjusted for each cell based on adjusting conductances of corresponding T1 and T2.

20. The method of claim 19, wherein the conductances are adjusted for each cell based on adjusting one or more of threshold voltages and sizes of corresponding T1 and T2.

* * * * *